(12) United States Patent
Brooks et al.

(10) Patent No.: US 6,708,053 B1
(45) Date of Patent: Mar. 16, 2004

(54) BIOCHEMICAL MARKERS OF BRAIN FUNCTION

(75) Inventors: William M. Brooks, Albuquerque, NM (US); Rex Jung, Albuquerque, NM (US); Seth David Friedman, Seattle, WA (US); Helen Petropoulos, Albuquerque, NM (US); Ronald A. Yeo, Albuquerque, NM (US); Wilmer L. Sibbitt, Albuquerque, NM (US)

(73) Assignee: Science and Technology Corp. @ UNM, Albuquerque, NM (US)

( * ) Notice: Subject to any disclaimer, the term of this patent is extended or adjusted under 35 U.S.C. 154(b) by 0 days.

(21) Appl. No.: 09/518,195

(22) Filed: Mar. 3, 2000

Related U.S. Application Data

(60) Provisional application No. 60/123,024, filed on Mar. 4, 1999.

(51) Int. Cl.[7] ........................ A61B 5/055; G01N 24/00
(52) U.S. Cl. ........................ 600/410; 436/173
(58) Field of Search .................. 600/410, 407; 324/307, 309; 436/173

(56) References Cited

U.S. PATENT DOCUMENTS

| | | |
|---|---|---|
| 4,332,566 A | 6/1982 | Mazeski et al. |
| 5,200,345 A | 4/1993 | Young |
| 5,357,959 A | 10/1994 | Fishman |
| 5,617,861 A | 4/1997 | Ross et al. |
| 5,887,588 A | 3/1999 | Usenius et al. |
| 6,347,239 B1 * | 2/2002 | Arnold et al. ............. 600/410 |

OTHER PUBLICATIONS

Cruz et al. "Proton MR Spectroscopic Imaging of the Striatum in Parkinson's Disease," Dec. 1996, Magnetic Resonance Imaging, vol. 15, No. 6, pp. 619–624.*

Christiansen et al. "Reduced N–Acetylaspartate Content in the Frontal Part of the Brain in Patients with Probable Alzheimer's Disease," Jan. 1994, Magnetic Resonance Imaging, vol. 13, No. 3, pp. 457–462.*

Ryou et al. "Dementia in Parkinson's diease—Examination according to Wechsler adult intelligence scale", Sep. 1997, Journal of the Neurological Sciences, vol. 150, Issue 1001, p. S319.*

Lucivero et al. "Proton magnetic resonance spectroscopy in Parkinson's disease and atypical parkinsonian disorders," Journal of the Neurological Sciences, vol. 150, Issue 1001, p. S316.*

Anderson et al., "Temporal Lobe $pH_i$ and IQ: No Consistent Correlation." *Intellegence* 1998; 26(2): 75–79.

Andreasen et al., "Intelligence and Brain Structure in Normal Individuals." *Am. J. Psychiatry* 1993; 150:130–134.

Barker et al., "Quantitative Proton Spectroscopy of Canine Brain: in Vivo and in Vitro Correlations." MRM 1994; 32: 157–163.

Bates et al., "Inhibition of N–acetylaspartate production: implications for $^1$H MRS studies in vivo." *NeuroReport* 1996; 7:1397–1400.

(List continued on next page.)

*Primary Examiner*—Shawna J Shaw
(74) *Attorney, Agent, or Firm*—Roberts Abokhair & Mardula, LLC

(57) ABSTRACT

The present invention provides methods for determining brain functioning in an individual by measuring the amount of either N-acetylaspartate or choline in an individual's brain. The present invention also provides methods for determining a change in an individual's brain functioning due to a change in the concentration of N-acetylaspartate or choline in the individual's brain.

13 Claims, 1 Drawing Sheet

OTHER PUBLICATIONS

Brooks et al., "Relationship Between Neurometabolite Derangement and Neurocognitive Dysfunction in Systematic Lupus Erythematosus." *The Journal of Rheumatology* 1999; 26:81–85.

Brooks et al., "Reproducibility of $^1$H–MRS In Vivo." *Magnetic Resonance in Medicine* 1999; 41:193–197.

Ceci et al., "Schooling, Intelligence, and Income." *American Psychologist* 1997; 52(10): 1051–1058.

Davie et al., "Proton Magnetic Resonance Spectroscopy of Systemic Lupus Erythematosus Involving the Central Nervous System." *J. Neurol.* 1995; 242: 522–528.

Deary et al., "Neuroscience and Human Intelligence Differences." *TINS* 1997; 20(8): 365–370.

Friedman et al., "Proton MR Spectroscopic Findings Correspond ot Neuropsychological Function in Traumatic Brain Injury." *AJNR Am. J. Neuroradiol* 1998; 19:1879–1885.

Freidman et al., "Quantitative proton MRS predicts outcome after traumatic brain injury." *Neurology* 1999; 52: 1384–1391.

Gadian et al., "Lateralization of brain function in childhood revealed by magnetic resonance spectroscopy." *Neurology* 1996; 46:974–977.

Haseler et al., "Proton MR Spectroscopic Meaurement of Neurometabolites in Hepatic Encephalopathy during Oral Lactulose Therapy." *AJNR Am. J. Neuroradiol* 1998; 19: 1681–1686.

Huda et al., "Clinical Correlation of Neuropsychological Tests With $^1$H Magnetic Resonance Spectroscopy in Hepatic Encephalopathy." *Psychosomatic Medicine* 1998; 60: 550–556.

Lopez–Villegas et al., "Biochemical changes in the frontal lobe of HIV–infected individuals detected by magnetic resonance spectroscopy." *Proc. Natl. Acad. Sci. USA* 1997; 94, 9854–9859.

Martin et al., "Brain Proton Magnetic Resonance Spectroscopy Studies in Recently Abstinent Alcoholics." *Alcohol Clin. Exp. Res.* 1995; 19(4): 1078–1082.

Matarazzo, "Psychological Testing and Assessment in the $21^{st}$ Century." *American Psychologist* 1992; 47(8): 1007–1018.

Mesulam, "Large Scale Neurocognitive Networks and Distributed Processing for Attention, Language, and Memory." *Ann. Neurol.* 1990; 28: 597–613.

Rae et al., "Brain biochemistry in Duchenne muscular dystrophy: A $^1$H magnetic resonance and neuropsychological study." *Journal of Neurological Science* 1998; 160: 148–157.

Rae et al., "Brain biochemistry in Williams syndrome: Evidence for a role of the cerebellum in cognition?" *Neurology* 1998; 51:33–40.

Rae et al., "Is pH a Biochemical Marker of IQ?" *Proc. R. Soc. Lond. B* 1996; 263: 1061–1064.

Rajanayagam et al., "Proton MR Spectroscopy and Neruopsychological Testing in Adrenoleukodystrophy." *AJNR Am. J. Neuroradiol* 1997; 18: 1909–1914.

Reiss et al., "Brain development, gender and IQ in children: A volumetric imaging study." *Brain* 1996; 119: 1763–1774.

Ross et al., "Clinical Applications of Magnetic Resonance Spectroscopy." *Magnetic Resonance Quarterly,* 1994; 10(4): 191–247.

Ross et al., "$^1$H MRS in Acute Traumatic Brian Injury." *JMRI* 1998; 8:829–840.

Tambs et al., "Genetic and Environmental Contributions to the Covariation Between the Wechsler Adult Intelligence Scale (WAIS) Subtests: A Study of Twins." *Behavior Genetics* 1986; 16(4): 475–491.

Urenjak et al., "Proton Nuclear Magnetic Resonance Spectroscopy Unambiguously Identifies Different Neural Cell Types." *The Journal of Neuroscience,* 1993; 13(3): 981–989.

Wechsler, "Wais–III Administration and Scoring Manual."

* cited by examiner

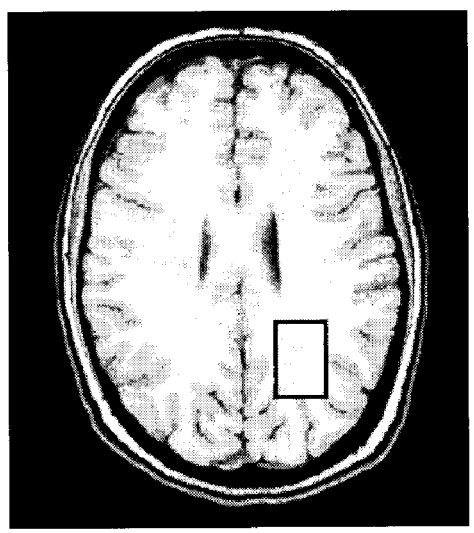
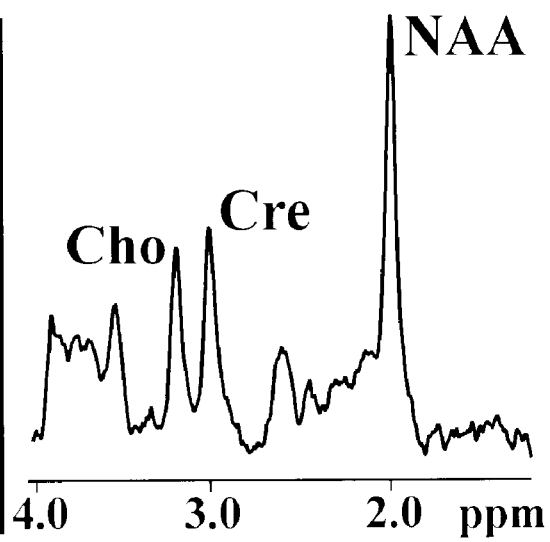
Fig. 1A    Fig. 1B
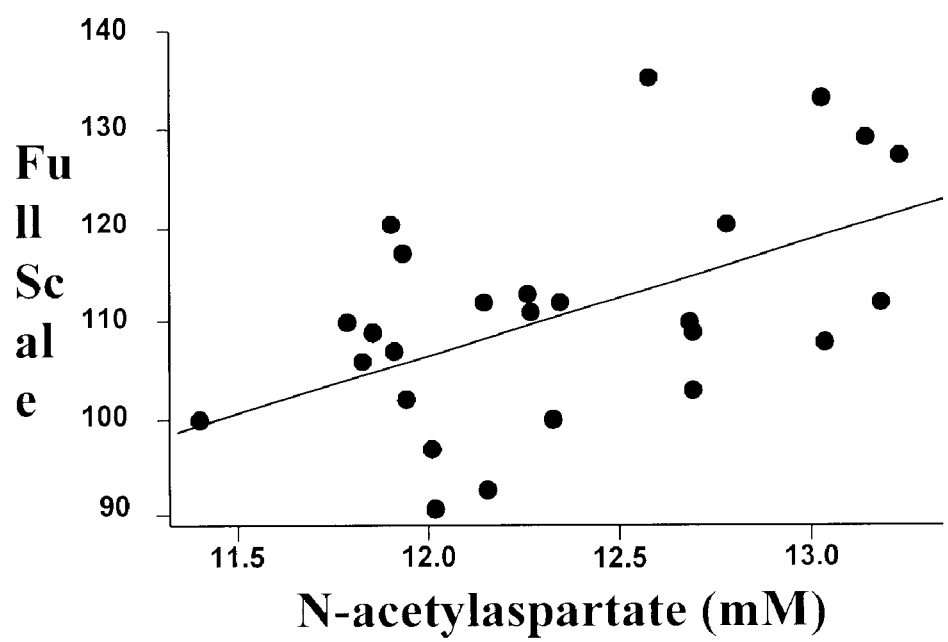
Fig. 2

US 6,708,053 B1

BIOCHEMICAL MARKERS OF BRAIN FUNCTION

CROSS-REFERENCE TO RELATED APPLICATIONS

This application makes reference to co-pending U.S. Provisional Patent Application No. 60/123,024 entitled "Biochemical Markers of Intelligence: A Proton MR Spectroscopy Study of Normal Human Brain," filed Mar. 4, 1999. The entire contents and disclosure of this Provisional Patent Application are hereby incorporated by reference.

GOVERNMENT INTEREST STATEMENT

This invention is made with government support under Grant Number RO1 NS35708 entitled "The Pathophysiology of Neuropsychiatric Systemic Lupus Erythematosus" awarded by the NIH National Institute of Neurologcial Diseases and Stroke. The government may have certain rights in this invention.

BACKGROUND OF THE INVENTION

1. Field of the Invention

The present invention relates generally to methods to MR Spectroscopy.

2. Description of the Prior Art

Problems with determining brain functioning in the past have included determining when someone has reduced brain functioning due to a disease such as: Alzheimer's disease, due to a traumatic injury such as: a gun shot wound, etc., exposure to radiation, exposure to a biochemical agent, etc.

Current ways of determining brain functioning include standard IQ tests, neuropsychological tests etc. However, many of the most popular types of methods of determining brain functioning are subjective in nature and may depend on the quality of the test being administered or the skills of the person administering a particular test to an individual.

SUMMARY OF THE INVENTION

One object of the present invention is to provide a more reliable method for determining the brain functioning of an individual.

Another object of the present invention is to provide an objective test for determining the brain functioning of an individual.

Yet another object of the present invention is to provide a method for determining a decrease or increase in brain functioning of an individual.

Yet another object of the present invention is to provide a method that is able to determine if an individual has suffered a traumatic injury that affects brain functioning.

Yet another object of the present invention is to provide a method that is able to determine if an individual is suffering from a disease that affects brain functioning.

Yet another object of the present invention is to provide a method that is able to determine if an individual has been exposed to a chemical or biochemical agent that affects brain functioning.

Yet another object of the present invention is to provide a method that is able to determine if an individual has been exposed to radiation that affects brain functioning.

According to a first aspect of the present invention, there is provided a method for determining brain functioning comprising: measuring the concentration of at least one MRS-visible brain chemical in a portion of an individual's brain; and determining brain functioning in the individual based on the concentration of at least one MRS-visible brain chemical measured.

According to a second aspect of the present invention, there is provided a method for determining a change in brain functioning comprising: measuring a first concentration of at least one MRS-visible brain chemical in a first portion of a brain of an individual at a first time; measuring a second concentration of at least one MRS-visible brain chemical in a second portion of said brain of the individual at a second time; and determining a change in the brain functioning, if any, of the individual based on the difference between said second concentration of at least one MRS-visible brain chemical measured and said first concentration of at least one MRS-visible brain chemical measured.

According to a third aspect of the present invention, there is provided a method for determining a change in brain functioning comprising: measuring a current concentration of at least one MRS-visible brain chemical in a portion of an individual's brain; and determining a current brain functioning in the individual based on the concentration of at least one MRS-visible brain chemical measured; determining a change in brain functioning, if any, for the individual based on comparing said current brain functioning to a previously determined brain functioning for the individual.

According to a fourth aspect of the present invention, there is provided a method for determining a change in brain functioning comprising: measuring a first concentration of at least one MRS-visible brain chemical in a first portion of a brain of an individual; measuring a second concentration of said at least one MRS-visible brain chemical in a second portion of said brain of the individual; and comparing said second concentration of at least one MRS-visible brain chemical measured to said first concentration of at least one MRS-visible brain chemical measured.

Other objects and features of the present invention will be apparent from the following detailed description of the preferred embodiment.

BRIEF DESCRIPTION OF THE DRAWINGS

The invention will be described in conjunction with the accompanying drawings, in which:

FIG. 1A is a Magnetic Resonance Image showing voxel location within the left occipito-parietal white matter of a typical individual;

FIG. 1B is a Magnetic Resonance Spectra based on the MRI of FIG. 1A and resulting spectra from one experimental participant, where Cho=Choline containing compounds; Cre=Creatine; NAA=N-acetylaspartate; and ppm=parts per million;

FIG. 2 is a Scatterplot showing the correlation (r=0.52) between Full Scale Intelligence Quotient and N-acetylaspartate (NAA) for a number of individuals.

DETAILED DESCRIPTION OF THE PREFERRED EMBODIMENT

Definitions

Where the definition of terms departs from the commonly used meaning of the term, applicant intends to utilize the definitions provided below, unless specifically indicated.

For the purposes of the present invention, the abbreviation "NAA" refers to N-Acetylaspartate, the abbreviation "Cho" refers to Choline, and the abbreviation "Cre" refers to Creatine.

For the purposes of the present invention, the abbreviation "VIQ" refers to Verbal Intelligence Quotient, the abbreviation "PIQ" refers to Performance Intelligence Quotient, and the abbreviation "FSIQ" refers to Full Scale Intelligence Quotient. Each of the intelligence quotients VIQ, PIQ, and FSIQ has a mean of 100 and a standard deviation of 15. In general, FSIQ is calculated from the measurements of VIQ and PIQ made on an individual.

For the purposes of the present invention, the abbreviation "SEp" refers to Standard Error of prediction.

For the purposes of the present invention, the term "individual" refers to either an individual person or animal.

For the purposes of the present invention, the term "brain functioning" refers to any conventional measure of brain functioning including: intelligence, intelligence quotient, electrical brain activity, etc.

For the purposes of the present invention, the term "MRS-visible brain chemical" refers to any chemical in a brain whose concentration can be measured using magnetic resonance spectroscopic techniques. Examples of MRS-visible brain chemicals include NAA, Cho, Cre, myo-Inositol, lactate, glutamate, glutamine, GABA (gamma-amino butyric acid), lipids, etc.

For the purposes of the present invention, the term "standard brain functioning" refers to the normal brain functioning of individuals similar to the individual whose brain functioning is being determined. For example, an individual who is 6 years old could have her brain functioning compared against the standard brain functioning of other 6 year olds, i.e. the typical brain functioning of other 6 year olds for the particular brain functioning being determined for an individual. Such comparisons may be necessary where an individual's brain functioning has not been previously measured prior to determining the individual's current brain functioning.

For the purposes of the present invention, the term "drug" refers to any type of substance that is commonly considered a drug. For the purposes of the present invention, a drug may be a substance that acts on the central nervous system of an individual, e.g. a narcotic, hallucinogen, barbiturate, or a psychotropic drug. For the purposes of the present invention, a drug may also be a substance that kills or inactivates disease-causing infectious organisms. In addition, for the purposes of the present invention, a drug may be a substance that affects the activity of a specific cell, bodily organ or function. A drug may be an organic or inorganic chemical, a biomaterial, etc.

Description

Proton magnetic resonance spectroscopy (1H-MRS) offers a unique non-invasive approach to measurement of N-Acetylaspartate (NAA) and choline (Cho), putative markers of neuronal and glial integrity. Previous studies reveal that these neurochemicals predict cognitive impairment in disease, although little is known about their relationship to cognitive functioning in healthy subjects.

Despite much controversy regarding its nature and determinants, the construct of intelligence figures prominently in both psychology and society. The psychological study of intelligence has yielded a hierarchical model with a broad overarching general intellectual factor (g), and underlying specific abilities, see Anderson, *Intelligence and Development: A Cognitive Theory*, (Blackwell, 1992). Further attempts have been made to reduce the bases of human intelligence into "cognitive correlates" hypothesized to be fundamental underpinnings of intellectual reasoning, see Vernon, *Speed of Information Processing and Intelligence*, (Ablex, 1987), pp. 177–200. Individual variation in intelligence predicts school and occupational attainment better than any other single attribute, see Ceci, et al., "Schooling, intelligence, and income" in *Amer. Psycholog.*, (1997), 52:1051–1058. Genetic and environmental differences contribute to individual variation in intelligence, in approximately equal measure, see Tambs, et al., "Genetic and environmental contributions to the covariation between the Wechsler Adult Intelligence Scale (WAIS) subtests: a study of twins" in *Behav. Genet.*, (1986), 16:475–91. As the fields of psychological assessment and neuroimaging have developed there have been many attempts to specify exactly what components of brain variation are associated with individual differences in intelligence, see Matarazzo, "Psychological testing and assessment in the 21st century" in *Amer. Psycholog.*, (1992), 47:1007–1018. The recognition of this important, but poorly understood, brain-intelligence link has resulted in the introduction of increasingly sensitive and diverse methods to study brain structure, electrical activity, and metabolism in relation to specific intellectual abilities, see Deary, et al., "Neuroscience and human intelligence differences" in *Trends in Neuosci.*, (1997) 20: 365–371.

Head circumference studies have yielded only small correlations with Intelligence Quotient (IQ), see Wickett, et al., *Personal. Individ. Diff.*, (1994) 16:831–838, and Gould, *The Mismeasure of Man*, (New York: W. W. Norton, 1981), and direct brain measurement with magnetic resonance imaging (MRI) has shown that Full Scale IQ generally correlates with brain volumes. Across two recent studies with substantial sample sizes, brain volume accounted for 16% Reiss, et al., "Brain development and IQ in children: A volumetric imaging study" in *Brain*, (19965), 119:1763–1774, and 4%, see Andreasen, et al., "Intelligence and brain structure in normal individuals" in *Amer. J. Psychiat.*, (1993), 150:130–134, of the variance in IQ scores. Thus, while the "quantity" of brain tissue may account for a certain fraction of the variance, other factors including cellular integrity, "quality" of the neuronal circuitry, dendritic arbor, number of synapses, and metabolic efficiency likely account for the remaining variance in intelligence, see Andreasen, et al., "Intelligence and brain structure in normal individuals. *Amer. J. Psychiat.*, (1993), 150:130–134.

Magnetic resonance spectroscopy (MRS) allows for analysis of brain chemistry in viva. Rae and colleagues, see Rae, et al., "Is pH a biochemical marker of IQ?" in *Proc. Roy. Soc. London. B.*, (1996), 263:1061–1064, have reported a strong correlation (r=0.52) between IQ and brain pH, as determined from phosphorous (31P-MRS), in normal subjects although a study of the temporal lobe in epileptic patients failed to replicate this finding Anderson, et al., "Temporal lobe pH and IQ: no consistent correlation" in *Intelligence*, (1998), 26:75–79. Proton magnetic resonance spectroscopy (1H-MRS) detects signals from neurometabolites including N-acetylaspartate (NAA), creatine (Cre), and choline-containing compounds (Cho). Reduced NAA is commonly associated with neuronal injury or death, see Ross, B, et al. (1994). "Clinical applications of magnetic resonance spectroscopy" in *Magn. Reson. Q.*, (1994), 10:191–247; impaired cognition, see Brooks, et al., "Relationship between neurometabolite derangement and neurocognitive dysfunction in systemic lupus erythematosus" in *J. Rheumatol.*, (1999), 26:81–5, and Friedman. et al., "Proton MR spectroscopic findings correspond to neuropsychological function in traumatic brain injury" in *Am. J. Neuroradiol.*, (1998), 19:1879–85; and poor functional outcome, see Friedman, et al., "Quantitative 1H-MRS predicts outcome following traumatic brain injury" in *Neurology*, (1999), 52:1384–1391. The Cre peak represents the sum of intracellular creatine and phosphocreatine. The Cho peak reflects the sum of all visible choline moieties—predominantly glycerophosphocholine and phosphocholine, see Barker, et al., "Quantitative proton spectroscopy of canine brain: in vivo and in vitro correlations" in *Magn. Reson. Med.*, (1994), 32:157–63; and is commonly elevated in stroke and multiple sclerosis due to membrane breakdown, inflammation, and/or demyelination see Ross, et al. "Clinical applications of magnetic resonance spectroscopy" in *Magn. Reson. Q.*, (1994), 10:191–247.

While 1H-MRS provides measures of neuronal injury and/or viability in overt disease, the functional correlates of neurometabolites measured by 1H-MRS in healthy brain have rarely been studied. Nonetheless, an emerging body of MRS literature links neurometabolic abnormalities to cognitive dysfunction in such diseases as HIV encephalopathy, see Lopez-Villegas, et al., "Biochemical changes in the frontal lobe of HIV-infected individuals detected by magnetic resonance spectroscopy" in *Proc. Nat. Acad. Sci.*, (1997), 94:9854–9859; adrenoleukodystrophy, see Rajanayagam, et al., "Proton MR spectroscopy and neuropsychological testing in adrenoleukodystrophy" in *Amer. J. Neurorad.*, (1997), 18:1909–1914; hepatic encephalopathy, see Huda, et al. "Clinical correlation of neuropsychological tests with 1H magnetic resonance spectroscopy in hepatic encephalopathy" in *Psychosom. Med.*, (1998), 60:550–6; and Haseler, et al., "Proton MR spectroscopic measurement of neurometabolites in hepatic encephalopathy during oral lactulose therapy" in *Am. J. Neuroradiol.*, (1998) 19:1681–6; traumatic brain injury, see Friedman, et al., "Proton MR spectroscopic findings correspond to neuropsychological function in traumatic brain injury" in *J. Neuroradiol.*, (1998), 19:1879–85, Friedman, et al. "Quantitative 1H-MRS predicts outcome following traumatic brain injury" in *Neurology*, (1999), 52:1384–1391, and Ross, et al., "1H MRS in acute traumatic brain injury" in *J. Magn. Reson. Imag.*, (1998), 8:829–40; and neuropsychiatric systemic lupus erythematosus, see Brooks, et al., "Relationship between neurometabolite derangement and neurocognitive dysfunction in systemic lupus erythematosus" in *J. Rheumatol.*, (1999), 26:81–5. The present invention assumes that, just as in disease, neurometabolic status contributes to variation in brain function in normal individuals. Hence, 1H-MRS measures of neurometabolic concentrations may be associated with intellectual functioning in the normal human brain.

The present invention uses the concentrations of NAA or Cho measured in an individual's brain to allow for the determination of brain functioning.

Typical ways of measuring NAA or Cho concentration in an individual's brain for the purposes of the present invention include Single Voxel proton magnetic resonance spectroscopy or Multi-Voxel proton magnetic resonance spectroscopy or proton magnetic resonance spectroscopy spectroscopic imaging.

The portion of an individual's brain which is analyzed by MRS to determine the concentration of NAA or Cho may depend on the particular brain functioning being determined and the type of individual being analyzed. For example, as described below, for analyzing the IQ of a normal individual, preferably the concentration of NAA or Cho is measured in the individual's occipito-parietal white matter. To analyze the neuropsychological functioning of a normal individual, preferably the concentration of NAA or Cho is also measured in the individual's occipito-parietal white matter. To analyze the brain functioning of an individual either suffering from or suspected of suffering from Neuropsychiatric Lupus Erythematosus, preferably the concentration of NAA or Cho is measured in an individual's left frontal white matter, although other portions of the brain may also be useful. To analyze the brain functioning of someone suffering from or suspected of suffering from Traumatic Brain Injury, preferably the concentration of NAA or Cho is measured in the individual's occipital gray matter (midline—adjacent to the voxel in FIG. 1A). To analyze the brain functioning of someone suffering from or suspected of suffering from Vascular Dementia, preferably the concentration of NAA or Cho is measured in the occipito-parietal white matter.

Once the NAA concentration for an individual is measured, the concentration of NAA can be converted into a FSIQ, a VIQ and a PIQ for the individual using the following equation, where [NAA] is the concentration of NAA measured in mM:

$$FSIQ=-28.97+11.31[NAA] \text{ with a } SEp \text{ of } \sim 9.9 \quad (1a)$$

$$VIQ=-36.79+11.93[NAA] \text{ with a } SEp \text{ of } \sim 11.6 \quad (1b)$$

$$PIQ=12.67+7.82[NAA] \text{ with a } SEp \text{ of } \sim 8.4 \quad (1c)$$

Once the Cho concentration for an individual is measured, the concentration of Cho can be converted into a FSIQ, a VIQ and a PIQ for the individual using the following equations, where [Cho] is the concentration of Cho measured in mM:

$$FSIQ=144.51-20.42[Cho] \text{ with a } SEp \text{ of } \sim 10.9 \quad (2a)$$

$$VIQ=139.35-17.38[Cho] \text{ with a } SEp \text{ of } \sim 12.9 \quad (2b)$$

$$PIQ=143.10-20.47[Cho] \text{ with a } SEp \text{ of } \sim 8.6 \quad (2c)$$

Additionally, the concentrations of NAA and Cho measured can used together to determine FSIQ and PIQ according to the following equations, where [NAA] is the concentration of NAA measured in mM and [Cho] is the concentration of Cho measured in mM:

$$FSIQ=-4.71+12.94[NAA]-27.06[Cho] \text{ with a } SEp \text{ of } 8.7 \quad (3a)$$

$$PIQ=-35.33+9.34[NAA]-25.27[Cho] \text{ with a } SEp \text{ of } 7.2 \quad (3b)$$

The present invention is also useful in determining whether an individual has had a change in brain functioning. An individual's brain functioning can be decreased due to suffering from a disease such as Alzheimer's, etc., a traumatic injury such as a gun shot wound, etc., exposure to radiation, exposure to a chemical or biochemical agent, etc. Conversely, an individual's brain functioning may go up as an individual recovers from any of these brain functioning decreasing events, as an individual's brain heals naturally or due to a medical treatment an individual receives.

In order to measure a change in brain functioning, an individual's brain function is determined by measuring the concentration of NAA or Cho at a first point in time and then measuring the concentration of NAA or Cho in the individual's brain at a second point of time. A decrease in the concentration of NAA measured or an increase in the amount of Cho measure is generally indicative of a lost of brain functioning. Conversely, an increase in the amount of NAA or a decrease in the amount of Cho is indicative of a improvement or recovery of brain functioning.

Using the method of the present invention, if a level of brain functioning, such as FSIQ, is determined for an individual at a first point by using the concentration of NAA or the concentration of Cho measured for the individual, this level of brain functioning can be compared with the level of brain functioning determined at a second point in time using the concentration of NAA or the concentration of Cho measured for the individual at the second point of time to determine if a loss or increase or recovery of brain functioning has occurred.

The method of the present invention has many applications, such as determining if an individual has suffered brain injury from trauma in a car accident, if a police officer has suffered brain injury from a gunshot wound, if an athlete has suffered brain injury from a blow to the head, if a neural disease such as Alzheimer's has developed in an individual and to what extent, if a soldier has been exposed to chemical or biochemical agents that affect the brain, etc.

The present invention may also be used in a drug testing environment to determine the effectiveness of a drug in treating a brain injury or disease in an individual. For example, the detection of an arrest in a fall of NAA or an increase in Cho may indicate that a drug has stop a deterioration in brain functioning. Also, the method of the present invention may be used to test the effectiveness of drugs that may help recovery from an inflammation such as TBI (Traumatic Brain Injury). The method of the present invention may allows for a physician treating an individual to monitor by MRS the recovery of neurons or resolution form inflammation in an objective manner.

The method of the present invention may also be used to measuring brain functioning pre- and post-administration of drug to determine enhancement of functioning from the pre-administration level. The method may be used to determine either if there has been an improvement of low level to higher level (recovery) or a reduction in the degradation of functioning over time due to progressive disease affecting brain functioning (slows progression). By measuring changes in brain functioning caused by varying the concentration of a drug administered, the method of the present invention may be used to assist in characterization of relevant pharmacological parameters, such as bioavailability (for example, 1000 units administered systemically, results in 100 units absorbed to blood, results in 1 unit crossing blood-brain barrier, results in 0.1 entering node of interest), modifications, half-life/clearance, changes in concentration of other relevant chemicals, etc. Additionally, the method of the present invention may be used to compare function levels of one or more drugs to another standard, such as another drug, to determine the drug with most enhancement of brain functioning.

The present invention also allows for a loss of brain functioning to be determined by comparing a current brain functioning, determined using the method of the present invention, against a previously determined brain functioning determined using some others method such as a conventional IQ testing or neuropsychological testing. Using the method of the present invention, an individual's current brain function may also be compared to a standard brain function, such as the normal brain functioning of individuals similar to the individual whose brain functioning is being determined.

The present invention will now be discussed by way of example.

EXAMPLE 1

The concentrations of NAA and Cho in the left occipito-parietal white matter of 26 healthy adults were measured and these measurements were compared with intellectual performance assessments using the Wechsler Adult Intelligence Scale –3. It was found that NAA (b=0.6,p<0.01) and Cho (b=–0.42,p<0.01) were independently associated with Full Scale Intelligence Quotient (FSIQ). Together, these metabolites accounted for a large proportion of the variance in intelligence (r2=0.45). Possible mechanisms underlying these correlations, such as mitochondrial function and myelin turnover, are discussed. 1H-MRS is a sensitive new tool to assess the neuronal underpinnings of cognitive function non-invasively.

EXAMPLE 2

Methods

Subjects: Twenty-seven participants (17 female, 10 male) were recruited from a local college community. Informed consent was obtained from all participants prior to study under a protocol approved by the Institutional Review Board. Participants were screened to exclude obvious organic or medical disease that might introduce bias into the study: prior traumatic brain injury, disorders of attention, learning disability, neurological disease, psychiatric diagnosis, and use of psychoactive medications. One participant did not meet experimental criteria listed above (psychiatric diagnosis treated with psychoactive medication) and was removed, leaving a final sample of twenty-six.

*Magnetic Resonance Imaging and Spectroscopy*: All MR acquisitions were carried out on a 1.5 Tesla clinical MR scanner using standard software (GE Medical Systems, Waukesha, Wis.). Imaging included sagittal T1—and axial T1—and T2—weighted series. A STEAM pulse sequence, including water suppression, was employed to sample one (12.6 cm3) voxel location (TE=30 ms, TR=2000 ms, 128 averages) within left occipito-parietal white matter. Specific voxel locations were prescribed from a T1—weighted axial imaging series, and were localized to maximize white- and minimize grey-matter contribution, see FIGS. 1A and 1B.

Spectroscopic Analysis: Spectroscopic data were transferred to a sun UltraSparcstation (SunMicrosystems, Mountain View, Calif.) for analysis using Magnetic Resonance User Interface (MRUI) (Leuven, Belgium). Residual water resonances were removed using time-domain Hankel Lanczos Singular Value Decomposition (HLSVD) filtering implemented in MRUI. Following water filtering, time-domain fitting of gaussian line shapes to NAA, Cre, and Cho was carried out by Variable Projection (VARPRO) to measure the areas corresponding to NAA, Cre, and Cho. The area from the water peak was determined independently from the unsuppressed water scan using Singular Value Decomposition (SVD). Data were quantified by employing the internal water signal as a concentration reference standard and correcting for metabolite and water T1 and T2 effects during echo and recycle times using literature values, see Barker, et al., "Quantitation of proton NMR spectra of the human brain using tissue water as an internal concentrations standard" in *NMR Biomed.*, (1993) 6:89–94.

Intellectual Measurement: in a second occasion (within a week of scanning), intellectual examination was undertaken with the Wechsler Adult Intelligence Scale—Third Edition (WAIS 3), a reliable, valid, and standardized test. Three subtests were not administered (Comprehension, Object Assembly and Picture Arrangement). Prorated summary scores were generated for Verbal IQ (VIQ) and Performance IQ (PIQ), from which the Full Scale Intelligence Quotient (FSIQ) was calculated. Each intelligence quotient (VIQ, PIQ, FSIQ) has a mean of 100 and a standard deviation of 15, see Wechsler, *Wechsler Adult Intelligence Scale—Third Edition: Administration and scoring manual.* (San Antonio: The Psychological Corporation—Harcourt Brace & Company, 1997).

Data analysis: Linear regression models were used to assess potential predictors of intelligence (FSIQ, VIQ, PIQ), the dependent variables. Independent variables were neurochemical concentrations of NAA, Cre, and Cho. Pearson correlation coefficients were used to assess the relationships between individual intellectual subtest scores and neurochemical concentrations. Statistical analysis was conducted in SPSS for Macintosh (SPSS Inc. 1995).

Results

As expected in a college-aged cohort, the mean scores on the WAIS-3 were above average and variance was slightly reduced compared to national norms, see Wechsler, *Wechsler Adult Intelligence Scale—Third Edition: Administration and scoring manual*. (San Antonio: The Psychological Corporation—Harcourt Brace & Company, 1997). The gender distribution of this sample reflected the undergraduate distribution of introductory psychology classes. Table 1 below summarizes the demographic, neurometabolic, and intellectual performance of the participants:

TABLE 1

Demographic, intellectual, and spectroscopic data from the sample.

|  | Mean | S.D. | Minimum | Maximum |
|---|---|---|---|---|
| Age | 22.0 | 4.6 | 17 | 35 |
| VIQ | 110.8 | 13.0 | 88 | 137 |
| PIQ | 109.5 | 9.2 | 94 | 127 |
| FSIQ | 111 | 11.4 | 91 | 135 |
| Cho (mM) | 1.64 | 0.18 | 1.32 | 2.02 |
| Cre (mM) | 6.79 | 0.44 | 5.92 | 7.77 |
| NAA (mM) | 12.38 | 0.53 | 11.39 | 13.29 |

(VIQ = Verbal Intelligence Quotient, PIQ = Performance Intelligence Quotient, FSIQ = Full Scale Intelligence Quotient; Cho = Choline, Cre = Creatine, NAA = N Acetylaspartate.)

High quality spectra were acquired from all participants. FIG. 1B shows a representative example of the spectral quality. Mean metabolic concentrations of this cohort were consistent with literature values, see Brooks, et al., "Reproducibility of 1H-MRS in vivo" in *Magn. Reson. Med.*, (1999) 41:193–197.

Spectroscopic measures of Cho and NAA were independently associated with IQ scores and accounted for a large proportion of the variance ($r2=0.23–0.45$). In each analysis, NAA was selected to be entered in the first step of the regression and was significant for all intellectual indices. Cho was then added to NAA in the second step, and was significant for FSIQ and PIQ, see Table 2 below:

TABLE 2

Statistically significant results from three step-wise regressions of IQ scores (FSIQ, VIQ, PIQ) on MRS metabolites (Cho, Cre, NAA).

| IQ score | R2 for model | Metabolite | Beta | P |
|---|---|---|---|---|
| FSIQ | 0.45 | NAA | 0.60 | 0.009 |
|  |  | Cho | −0.42 | 0.008 |
| VIQ | 0.23 | NAA | 0.44 | 0.013 |
| PIQ | 0.44 | NAA | 0.54 | 0.003 |
|  |  | Cho | −0.49 | 0.005 |

(FSIQ = Full Scale Intelligence Quotient, VIQ = Verbal Intelligence Quotient, IQ = Performance Intelligence Quotient; Cho = Choline, NAA = N Acetylaspartate; P = probability level.)

Cre was not significantly associated with any measure of intelligence quotient. Neither age nor gender was associated with metabolic measures (all $p>0.4$). Note that NAA concentrations were positively correlated with IQ and subtest scores, while Cho concentrations were negatively correlated with IQ and individual subtests, see Table 3 below:

TABLE 3

Pearson correlation coefficients
(and significance for probability levels
* < 0.05, ** < 0.01) for WAIS-3
subtests and MRS metabolites (Cho, Cre, NAA).

| WAIS-3 subtest | Cho | Cre | NAA |
|---|---|---|---|
| Full Scale IQ | −0.32 | 0.24 | 0.52** |
| Performance IQ | −0.40* | 0.14 | 0.45* |
| Picture Completion | −0.11 | 0.36 | −0.12 |
| Digit Symbol-Coding | −0.09 | 0.08 | 0.43* |
| Block Design | −0.30 | 0.02 | 0.41* |
| Matrix Reasoning | −0.39* | −0.13 | 0.13 |
| Symbol Search | 0.11 | 0.26 | 0.35 |
| Verbal IQ | −0.24 | 0.27 | 0.48* |
| Vocabulary | −0.19 | 0.44* | 0.32 |
| Similarities | −0.19 | 0.37 | 0.18 |
| Arithmetic | −0.36 | −0.05 | −0.36 |
| Digit Span | −0.08 | −0.17 | 0.38 |
| Information | −0.39 | 0.31 | 0.29 |
| Letter-Number Sequence | −0.39 | 0.31 | 0.29 |

(Cho = Choline, Cre = Creatine, NAA = N-Acetylaspartate.)

A scatterplot of the independent relationship between NAA and FSIQ is presented in FIG. 2.

The above results show the relationship between individual neurometabolic concentrations and intellectual function in the normal human brain. The relationship appears to be rather general, as both verbal and visuospatial intellectual skills were related to metabolite concentrations. The finding of independent relationships between NAA and Cho with IQ scores suggests that two independent factors influence intelligence in normal brain. However, the specific roles that NAA and Cho play in neuronal status in normal individuals have yet to be determined. In disease states decreased NAA and elevated Cho are related to poorer function and outcome, possibly indicative of neuronal damage and/or inflammation, sec Ross, et al., "Clinical applications of magnetic resonance spectroscopy" in *Magn. Reson. Q.*, (1994), 10:191–247, and Davie, et al., "Proton magnetic resonance spectroscopy of systemic lupus erythematosus involving the central nervous system" in *J. Neurology.*, (1995) 242:522–8. However, it is not certain that decreased NAA and elevated Cho reflect the same pathologic processes in this normal population. Rather, these observations may reflect natural variation in density and proportion of neurons and glial cells each of which have distinct neurometabolic patterns Urenjak, et al. "Proton nuclear magnetic resonance spectroscopy unambiguously identifies different neural cell types" in *J. Neuroscience*, (1993), 13:981–9.

NAA is associated with lower IQ in such disorders as mental retardation, see Hashimoto, et al., "Reduced N-acetylaspartate in the brain observed in in vivo proton magnetic resonance spectroscopy in patients with mental retardation" in *Pediair. Neurol.*, (1995), 13:205–208; temporal lobe epilepsy, see Gadian, et al. "Lateralisation of brain function in childhood revealed by magnetic resonance spectroscopy" in *Neurology*, (1996), 46:974–7; and Williams Syndrome, see Rae, et al. "Brain biochemistry in Williams Syndrome. Evidence for a cerebellar role in cognition?" in *Neurology*, (1998), 51:33–40. The above results extend these findings by showing that lower NAA is related to reduced performance in a sample comprised exclusively of normal subjects. Although reduced NAA may indicate neuronal death or injury, increasing evidence suggests that mitochondrial dysfunction may also cause decreases in this neurometabolite, see Fu, et al., "Catecholamines potentiate amyloid beta-peptide neurotoxicity: involvement of oxidative stress, mitochondrial dysfunction, and perturbed calcium homeostasis" in *Neurobiol. Dis.*, (1998), 5:229–43, and Bates, et al. "Inhibition of N-acetylaspartate production: implications for 1H MRS studies in vivo" in *Neuroreport*, (1996) 7:1397–1400. Specifically, inhibition of the mitochondrial respiratory chain has been demonstrated to lead to decreased NAA production, reflecting potentially reversible metabolic derangement as opposed to neuronal death per se, see Bates, et al. "Inhibition of N-acetylaspartate production: implications for 1H MRS studies in vivo" in *Neuroreport*, (1996) 7:1397–1400. In the context of normal brain functioning, this finding raises the possibility that variability in mitochodrial function might contribute to the functional capacity of the brain in total.

A negative correlation between Cho and IQ was also observed in the normal cohort. In disease, elevated Cho is associated with membrane breakdown and inflammation, see Davie, et al., "Proton magnetic resonance spectroscopy of systemic lupus erythematosus involving the central nervous system" in *J. Neurology.*, (1995) 242:522–8; and, two processes that are likely to impair cognitive functioning, see Brooks, et al. "Relationship between neurometabolite derangement and neurocognitive dysfunction in systemic lupus erythematosus" in *J. Rheumatol.*, (1999), 26:81–5, Friedman, et al., "Proton MR spectroscopic findings correspond to neuropsychological function in traumatic brain injury" in *J. Neuroradiol.*, (1998), 19:1879–85, Friedman, et al. "Quantitative 1H-MRS predicts outcome following traumatic brain injury" in *Neurology*, (1999), 52:1384–1391. However, other studies show increased Cho in the cerebellum associated with better intellectual functioning in Duchenne Muscular Dystrophy (DMD), see Rae et al., "Brain biochemistry in Duchenne muscular dystrophy: a 1H magnetic resonance and neuropsychological study" in *J. Neurol. Sci.*, (1998), 162:148–157; and recently abstinent alcoholics, see Martin, et al., "Brain proton magnetic resonance spectroscopy studies in recently abstinent alcoholics" in *Alcoholism: Clinical and Experimental Research*, (1995), 19:1078–1082; although some concerns regarding the comparability of these studies and the present results remain. For example, Cho is known to vary with changes in cell density and type, see Miller, et al., "In vivo 1H-MRS choline: correlation with in vitro chemistry/histology" in *Life Sci.*, (1996) 58:1929–1935. Indeed, Rae et al., "Brain biochemistry in Duchenne muscular dystrophy: a 1H magnetic resonance and neuropsychological study" in *J. Neurol. Sci.*, (1998), 162:148–157; report increased Cho in the cerebellum but not the frontal lobes. Secondly, the significance of changes in Cho following alcohol abuse and then abstinence is unclear. On the other hand, since myelin is under continuous repair even in normal subjects, higher concentrations of choline compounds might indicate more active myelin turnover, resulting in less efficient white matter functioning. Alternatively, elevated Cho could reflect a greater contribution from glial than neuronal elements, see Urenjak, et al. "Proton nuclear magnetic resonance spectroscopy unambiguously identifies different neural cell types" in *J. Neuroscience*, (1993), 13:981–9, reflecting natural variation in neuronal-glial composition associated with intelligence.

Unlike other functional neuroimaging studies, this protocol did not employ an activation paradigm, but rather explored the neurometabolic substrate of human brain function, that is, neurometabolites intrinsic to neurons and their supporting cells. Thus, the 1H-MRS technique explored the basic relationship of neurometabolite concentrations (i.e., brain tissue composition and status) to intellectual function, rather than brain anatomy or other metabolic indices such as blood flow or oxygen/glucose uptake. The finding that intracellular neurometabolites at rest are related to cognitive ability suggests a neuronal contribution to intelligence in normal subjects. Moreover, this metabolite-cognition link observed in healthy participants implies that at least some of the association observed between neurometabolites and cognition in disease may be related to premorbid neurometabolic factors.

Anatomical perspectives on cognition have emphasized the importance of white matter interconnections in multiple neuronal networks, see Mesulam, "Large-scale neurocognitive networks and distributed processing for attention, language, and memory" in *Annals Neurology*, (1990), 28:597–613. Accordingly, measurements of neurochemistry were made in occipito-parietal white matter. This brain location elected this brain location because it provides consistent high quality spectra, and metabolites in this location correlate with function in diseased cohorts, see Brooks, et al. "Relationship between neurometabolite derangement and neurocognitive dysfunction in systemic lupus erythematosus" in *J. Rheumatol.*, (1999), 26:81–5; Friedman, et al., "Proton MR spectroscopic findings correspond to neuropsychological function in traumatic brain injury" in *J. Neuroradiol.*, (1998), 19:1879–85; Friedman, et al. "Quantitative 1H-MRS predicts outcome following traumatic brain injury" in *Neurology*, (1999), 52:1384–1391. The main association pathways sampled by the present experimental paradigm included axonal fibers from the posterior aspects of the superior and inferior longitudinal, occipitofrontal, and arcuate fasciculi, as well as the splenium of the corpus callosum. As this voxel location sampled numerous association pathways connecting many brain regions, metabolic concentrations in this voxel may widely influence cognitive processing. However, the relationship between neurometabolite concentrations in this voxel and concentrations in other regions of the brain important to intellectual functioning (e.g., frontal lobes) remains to be determined.

Although the metabolite-IQ relationship has only been measured for one brain location, this relationship may also be observed with other locations throughout the brain, although findings from the cerebellum show some promise. Also, the concentration of NAA and Cho may provide useful information about other elements of cognitive ability in addition to intellectual functioning.

The central finding of associations between intelligence and biochemical markers of neuronal functioning in normal subjects demonstrates that 1H-MRS may prove to be a highly valuable tool within the cognitive neurosciences. Though much has been learned about brain function by "fine-grained" analysis of cognitive skill, the current results demonstrate that, for at least some questions, a broader perspective on cognitive functioning can illuminate brain-behavior relationships.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A method for determining brain functioning comprising:

measuring the concentration of N-Acetylaspartate in a portion of an individual's brain:

measuring the concentration of choline in said portion of said brain of the individual; and determining brain functioning in the individual based on the concentration of N-acetylaspartate measured and the concentration of choline measured, wherein said determining of brain functioning comprises determining the intelligence of the individual.

2. The method of claim 1, wherein said determining of brain functioning comprises determining FSIQ of the individual.

3. A method for determining a chance in brain functioning comprising:

measuring a first concentration of N-acetylaspartate in a first portion of a brain of an individual at a first time;

measuring a second concentration of N-acetylaspartate in a second portion of said brain of the individual at a second time;

determining a first brain functioning in the individual based on the first concentration of N-acetylaspartate measured;

determining a second brain functioning in the individual based on the second concentration of N-acetylaspartate measured; and determining a difference in the brain functioning, if any, of the individual based on the difference between said second brain functioning and said first brain functioning.

4. The method of claim 3 wherein said determinings of said first and said second brain functionings comprises determining the intelligence of the individual at said first time and said second time, respectively.

5. The method of claim 3 wherein said determinings of said first and said second brain functionings comprises determining the a VIQ of the individual at said first time and said second time, respectively.

6. The method of claim 3 wherein said determinings of said first and said second brain functionings comprises determining a PIQ of the individual at said first time and said second time, respectively.

7. The method of claim 3, wherein said determinings of said first and said second brain functionings comprises determining a FSIQ of the individual at said first time and said second time, respectively.

8. The method of claim 3, further comprising:

measuring a first concentration of choline in said first portion of said brain of the individual at said first time;

measuring a second concentration of choline in said second portion of said brain of the individual at a second time; and wherein said determining of said change in the brain functioning of the individual is based on the difference, if any, between said second concentration of N-acetylaspartate measured and said first concentration of N-acetylaspartate measured and the difference, if any, between said second concentration of choline measured and said first concentration of choline measured.

9. A method for determining a change in brain functioning comprising:

measuring a first concentration of choline in a first portion of a brain of an individual at a first time;

measuring a second concentration of choline in a second portion of said brain of the individual at a second time;

determining a first brain functioning in the individual based on the first concentration of choline measured;

determining a second brain functioning in the individual based on the second concentration of choline measured; and determining a difference in the brain functioning, if any, of the individual based on the difference between said second brain functioning and said first brain functioning.

10. The method of claim 9, wherein said determinings of said first and said second brain functionings comprises determining the intelligence of the individual at said first time and said second time, respectively.

11. The method of claim 9, wherein said determinings of said first and said second brain functionings comprises determining a VIQ of the individual at said first time and said second time, respectively.

12. The method of claim 9, wherein said determinings of said first and said second brain functionings comprises determining a PIQ of the individual at said first time and said second time, respectively.

13. The method of claim 9, wherein said determinings of said first and said second brain functionings comprises determining a FSIQ of the individual at said first time and said second time, respectively.

* * * * *